(12) United States Patent
Lee et al.

(10) Patent No.: US 7,986,049 B2
(45) Date of Patent: Jul. 26, 2011

(54) SEMICONDUCTOR DEVICE HAVING MULTIPLE-LAYER HARD MASK WITH OPPOSITE STRESSES AND METHOD FOR FABRICATING THE SAME

(75) Inventors: Jung-Seock Lee, Kyoungki-do (KR); Ki-Won Nam, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 12/837,399

(22) Filed: Jul. 15, 2010

(65) Prior Publication Data
US 2010/0276789 A1 Nov. 4, 2010

Related U.S. Application Data

(62) Division of application No. 11/823,772, filed on Jun. 28, 2007, now Pat. No. 7,781,347.

(30) Foreign Application Priority Data

Dec. 27, 2006 (KR) .......................... 10-2006-0134341

(51) Int. Cl.
*H01L 21/302* (2006.01)
(52) U.S. Cl. .................. 257/787; 257/E21.488; 438/717

(58) Field of Classification Search .................. 438/717; 257/787
See application file for complete search history.

(56) References Cited

U.S. PATENT DOCUMENTS

| 6,271,592 B1 | 8/2001 | Kim et al. ...................... 257/751 |
| 2004/0108599 A1 | 6/2004 | Takayama et al. ............. 257/763 |
| 2005/0153535 A1 | 7/2005 | Hwang et al. .................. 438/622 |

FOREIGN PATENT DOCUMENTS

| JP | 6-268077 | 9/1994 |
| KR | 2002-0017832 | 3/2002 |
| KR | 2003-0027795 | 4/2003 |
| KR | 10-2005-0035023 | 4/2005 |
| KR | 10-2006-0010932 A | 2/2006 |
| KR | 10-2006-0074995 A | 7/2006 |
| KR | 10-0636919 B1 | 10/2006 |

*Primary Examiner* — Ajay K Arora
(74) *Attorney, Agent, or Firm* — Blakely, Sokoloff, Taylor & Zafman

(57) ABSTRACT

A semiconductor device includes a hard mask including a first layer and a second layer in contact with each other and having opposite stress types, wherein a difference between initial stresses of the first layer and the second layer is increased so that after a thermal process, the difference between the final stresses of the first and second layer becomes smaller, to reduce the likelihood of peeling of the first or second layer. The initial stress of the first layer includes a compressive stress and the initial stress of the second layer includes a tensile stress.

5 Claims, 2 Drawing Sheets

SEMICONDUCTOR DEVICE HAVING MULTIPLE-LAYER HARD MASK WITH OPPOSITE STRESSES AND METHOD FOR FABRICATING THE SAME

CROSS-REFERENCE TO RELATED APPLICATION

The present patent application is a Divisional application claiming the benefit of application Ser. No. 11/823,772, filed Jun. 28, 2007 now U.S. Pat. No. 7,781,347.

CROSS-REFERENCE TO RELATED APPLICATIONS

The present invention claims priority of Korean patent application number 10-2006-0134341, filed on Dec. 27, 2006, which is incorporated by reference in its entirety.

BACKGROUND OF THE INVENTION

The present invention relates to a semiconductor device, and more particularly, to a semiconductor device including a multiple-layer hard mask with opposite stresses between layers and a method for fabricating the same.

Various processes have been performed to reduce undesirable events generated by decreased process margins between layers when forming a semiconductor device. For instance, gate lines and bit lines are using a multiple-layer structure to increase a self-aligned contact (SAC) margin during contact hole definition.

One of the limitations related to the usage of the multiple-layer structure is a peeling event. The peeling event refers to a portion of a layer in a stack structure peeling off due to differences in stress between layers and an increased stress change between the layers due to various subsequent thermal processes.

FIG. 1 illustrates a diagram showing a structure of a typical pattern. A first hard mask 12 is formed over a tungsten (W) layer 11. A second hard mask 13 is formed over the first hard mask 12. The tungsten layer 11 functions as a bit line and is denoted as 'BL W'. The first hard mask 12 may include a nitride-based layer and is denoted as 'HM NIT'. The second hard mask 13 may include a tungsten layer and is denoted as 'HM W'.

An initial stress after formation for the tungsten layer 11 and the second hard mask 13 is a tensile stress (TEN), and for the first hard mask 12 is a compressive stress (COMP). When a nitride-based layer and a tungsten-based layer contact, each layer typically obtains an opposite stress to each other.

The initial stress changes by the heat from subsequent thermal process 100 and thus a final stress having a different property than the initial stress results. For instance, the tungsten layer 11 and the second hard mask 13 may obtain a compressive stress and the first hard mask 12 may obtain a weak tensile stress, as represented with 'TEN - - - ', by a subsequent process for forming bit line spacers 14 accompanied with heat. At this time, the second hard mask 13 may obtain a strong compressive stress as represented with 'COMP —'. Accordingly, the initial stress and the final stress obtain an opposite property to each other by the subsequent thermal process. Reference numerals S1 and S11 refer to an initial stress difference S1 and a final stress difference S11 between the first hard mask 12 and the second hard mask 13.

However, in the typical pattern, subsequent processes may generate undesirable contacting events between the first hard mask 12 having the weak tensile stress (TEN - - - ) and the second hard mask 13 having the strong compressive stress (COMP —) formed at the top, causing a peeling event. That is, an interface becomes weak as the difference in stress becomes large between the first hard mask 12 and the second hard mask 13. Thus, the second hard mask 13 may be easily seceded by subsequent etch processes and cleaning processes.

SUMMARY OF THE INVENTION

Embodiments of the present invention are directed to a semiconductor device having a multiple-layer hard mask and a method for fabricating the same, which can reduce a peeling event while using a multiple-layer hard mask with opposite stresses.

In accordance with an aspect of the present invention, there is provided a semiconductor device, including a hard mask having a first layer and a second layer in contact with each other and having opposite stress types, wherein a large difference exists between initial stresses of the first layer and the second layer, and a small difference exists between final stresses of the first and second layers.

In accordance with another aspect of the present invention, there is provided a method for fabricating a semiconductor device, including forming a hard mask having a first layer and a second layer in contact with each other and having opposite types of stress, wherein prior to a thermal process, a large difference exists between initial stresses of the first layer and the second layer, and after the thermal process a small difference exists between the stresses of the first and second layer.

DESCRIPTION OF SPECIFIC EMBODIMENTS

Embodiments of the present invention relate to a semiconductor device having a multiple-layer hard mask with opposite stresses and a method for fabricating the same.

Figure 2:
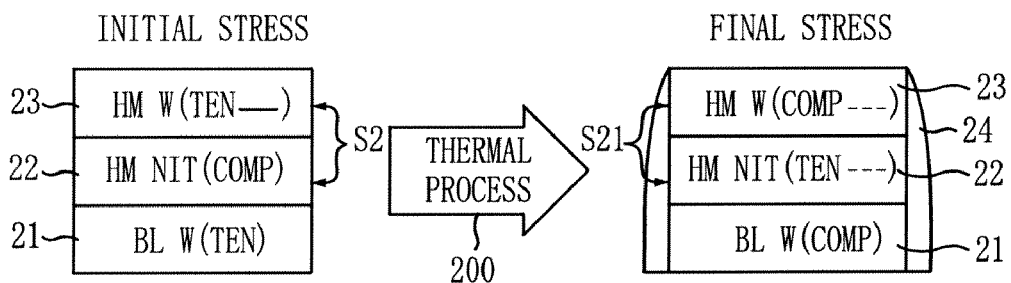
FIG. 2 illustrates a diagram showing a structure of a pattern using a multiple-layer hard mask in accordance with an embodiment of the present invention.

FIG. 2 illustrates a diagram showing a structure of a pattern using a multiple-layer hard mask in accordance with an embodiment of the present invention. A first hard mask 22 is formed over a tungsten (W) layer 21. A second hard mask 23 is formed over the first hard mask 22. The tungsten layer 21 functions as a bit line and is denoted as 'BL W'. The first hard mask 22 may include a nitride-based layer and is denoted as 'HM NIT'. The second hard mask 23 may include a tungsten layer and is denoted as 'HM W'.

An initial stress after formation for the tungsten layer 21 and the second, hard mask 23 is a tensile stress (TEN), and for the first hard mask 22 is a compressive stress (COMP).

In this embodiment of the present invention, the initial stress of the second hard mask 23, which is formed at the top, is controlled. For instance, the initial stress of the second hard mask 23 may be a strong tensile stress (TEN —), which is a stronger tensile stress than a tensile stress of a typical hard mask including tungsten. Thus, if the second hard mask 23 is formed in a manner to obtain the strong tensile stress as the initial stress, the second hard mask 23 may obtain a weak compressive stress (COMP - - - ) as a final stress through a subsequent thermal process 200, alleviating the size of the compressive stress. Meanwhile, a final stress of the first hard mask 22 may obtain a weak tensile stress (TEN - - - ) by the thermal process 200.

Thus, a difference between the final stresses becomes minimized when the weak tensile stress of the first hard mask 22 and the weak compressive stress of the second hard mask 23 result through the thermal process 200, reducing peeling events.

In the multiple-layer hard mask including the first hard mask 22 having the compressive stress as the initial stress and the second hard mask 23 having the tensile stress as the initial stress, a difference between the initial stresses of the first hard mask 22 and the second hard mask 23 is set to be large such that the difference between the final stresses of the first hard mask 22 and the second hard mask 23 is minimized through the thermal process 200. Consequently, the peeling event may be reduced. Furthermore, the thermal process 200 causes the stresses of the first hard mask 22 and the second hard mask 23 to be weak. Thus, the difference between the final stresses of the first hard mask 22 and the second hard mask 23 is minimized.

Figure 1:
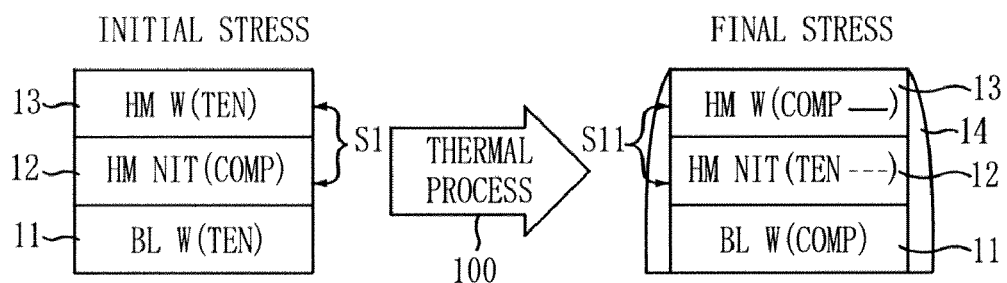
FIG. 1 illustrates a diagram showing a structure of a typical pattern.

In more detail, an initial stress difference 52 between the first hard mask 22 and the second hard mask 23 is large because the first hard mask 22 has the compressive stress and the second hard mask 23 has the strong tensile stress. The initial stress difference between the first hard mask 22 and the second hard mask 23 is larger than an initial stress difference S1 of a typical pattern shown in FIG. 1.

When the initial stress difference S2 is large, a final stress difference S21 after the thermal process 200 becomes small. That is, the first hard mask 22 obtains a weak tensile stress and the second hard mask 23 obtains a weak compressive stress, reducing the finial stress difference S21 between the two layers. The final stress difference S21 is smaller than a final stress difference S11 of the typical pattern shown in FIG. 1.

For instance, a strong tensile stress (TEN —) and a strong compressive stress (COMP —) refer to approximately $-3 \times 10^9$ [dyne/cm$^2$] or greater. A weak tensile stress (TEN - - - ) and a weak compressive stress (COMP - - - ) refer to approximately $-5.0 \times 10^9$ [dyne/cm$^2$] or less.

A method for forming the second hard mask 23 in a manner that the initial stress obtains the strong tensile stress is described as follows. The method includes: using direct current (DC) power of approximately 2 KW or less; flowing argon (Ar) gas and ArH gas at a rate ranging from approximately 10 sccm to approximately 100 sccm at a ratio of approximately 1:1; using a pressure in a chamber ranging from approximately 1 mTorr to approximately 10 mTorr; and maintaining a temperature inside the chamber ranging from approximately 20° C. to approximately 400° C. Thus, a strong tensile stress property may be maintained. For instance, the initial stress of the second hard mask 23 may be a strong tensile stress of approximately $-3 \times 10^9$ [dyne/cm$^2$] or greater.

Figure 3:
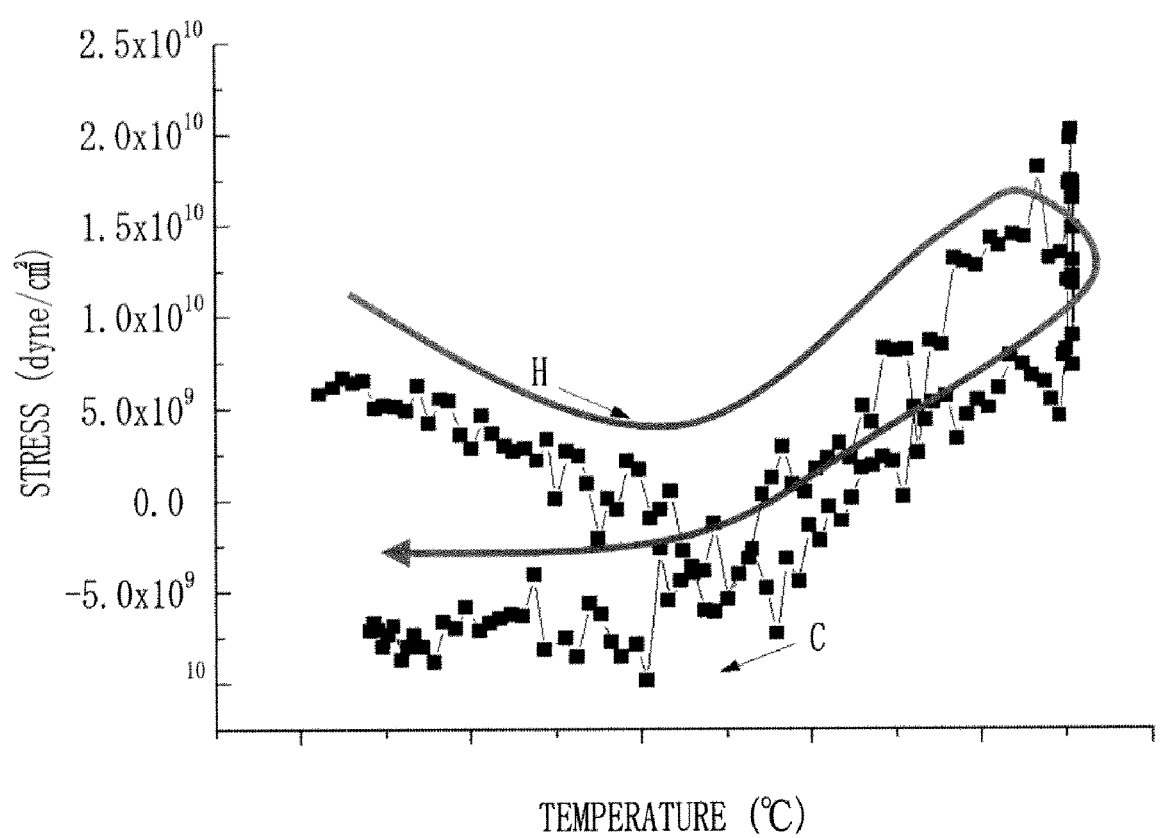
FIG. 3 illustrates a graph comparing initial stresses of a hard mask including a tungsten layer.

FIG. 3 illustrates a graph comparing initial stresses of a hard mask including a tungsten layer. A typical initial stress 'BL' and an initial stress according to this embodiment of the present invention (refer to 'NEW') are compared. The results shown in the graph are obtained by heating and cooling at a rate of approximately 1.0° C./min from approximately 0° C. to approximately 900° C.

The initial stress according to this embodiment of the present invention is very strong in a section of approximately 400° C. and lower when compared to the typical initial stress. The initial stress is a strong compressive stress.

The typical initial stress and the initial stress according to this embodiment of the present invention in the section of approximately 400° C. and lower are compared as follows. The typical initial stress ranges from approximately $5.0 \times 10^9$ [dyne/cm$^2$] to approximately $-5.0 \times 10^9$ [dyne/cm$^2$] when heating (H). That is, the typical initial stress decreases as the temperature increases. The typical initial stress ranges from approximately $-5.0 \times 10^9$ [dyne/cm$^2$] to approximately $-10.0 \times 10^9$ [dyne/cm$^2$] when cooling (C). The initial stress according to this embodiment of the present invention ranges from approximately $10 \times 10^9$ [dyne/cm$^2$] to approximately $-3.0 \times 10^9$ [dyne/cm$^2$] when heating (H). That is, the initial stress decreases as the temperature increases. The initial stress according to this embodiment of the present invention is uniform, being approximately $-3.0 \times 10^9$ [dyne/cm$^2$] when cooling (C). Thus, the initial stress of the tungsten layer according to this embodiment is stronger than the typical initial stress during heating and cooling.

According to an embodiment of the present invention, the final stress of the first hard mask including a nitride-based layer may be a weak tensile stress and the final stress of the second hard mask including a tungsten layer may be a weak compressive stress. Thus, a difference of stresses between the two layers decreases because the stresses of the two layers both have weak properties. Therefore, the two layers may maintain a stable contact, reducing generation of peeling events during subsequent thermal processes.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising
   a tungsten layer having a final stress comprising a compressive stress; and
   a hard mask formed over the tungsten layer including:
   a first layer having the final stress comprising a weak tensile stress formed over the tungsten layer; and
   a second layer having the final stress comprising a weak compressive stress formed over the first layer,
   wherein a large difference exists between initial stresses of the first layer and the second layer, and a small difference exists between final stresses of the first layer and the second layer, and the first layer comprises a nitride-based layer, and the second layer comprises a tungsten (W) layer.

2. The semiconductor device of claim 1, wherein the initial stress of the first layer comprises a compressive stress and the initial stress of the second layer comprises a tensile stress, wherein the initial stress of the second layer is a strong tensile stress such that a difference between the initial stresses of the first layer and the second layer is large.

3. The semiconductor device of claim 2, wherein the initial stress of the second layer is a tensile stress of approximately $-3 \times 10^9$ [dyne/cm$^2$] or greater.

4. The semiconductor device of claim 1, wherein the final stresses of the first layer and the second layer are approximately $-5 \times 10^9$ [dyne/cm$^2$] or less.

5. The method of claim 1, wherein the initial stress of the tungsten layer is a tensile stress.

* * * * *